(12) United States Patent
Chu

(10) Patent No.: US 6,498,742 B2
(45) Date of Patent: Dec. 24, 2002

(54) MEMORY DEVICE

(75) Inventor: Daping Chu, Cambridge (GB)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/866,780

(22) Filed: May 30, 2001

(65) Prior Publication Data

US 2002/0004875 A1 Jan. 10, 2002

(30) Foreign Application Priority Data

May 31, 2000 (GB) .............................................. 0013230

(51) Int. Cl.[7] .............................................. G11C 11/22
(52) U.S. Cl. ...................................... 365/145; 365/149
(58) Field of Search ................................. 365/145, 149

(56) References Cited

U.S. PATENT DOCUMENTS

| | | | |
|---|---|---|---|
| 4,161,038 A | | 7/1979 | Wu .............................. 365/145 |
| 5,309,391 A | * | 5/1994 | Papaliolios ................. 365/145 |
| 5,361,224 A | | 11/1994 | Takasu ........................ 365/145 |
| 5,535,154 A | * | 7/1996 | Kiyono ........................ 365/145 |
| 5,559,733 A | * | 9/1996 | McMillan et al. ........... 365/145 |
| 5,923,184 A | | 7/1999 | Ooms et al. .................. 326/50 |
| 6,233,169 B1 | * | 5/2001 | Nishimura ................... 365/145 |
| 6,314,016 B1 | * | 11/2001 | Takasu ........................ 365/145 |

* cited by examiner

*Primary Examiner*—Trong Phan
(74) *Attorney, Agent, or Firm*—Oliff & Berridge, PLC

(57) ABSTRACT

A memory device including an n-channel transistor and p-channel transistor, both transistors having a source, a drain and a gate, the source and drains of the transistors being connected in series and the gates of the transistors being connected together, with each transistor having a ferroelectric material separating the gate from the source and drain thereof. Preferably a single ferroelectric material acts as the ferroelectric material for both transistors and a single gate acts as the gate for both transistors. Beneficially the device includes a single substrate having an n-type source, an n-type drain, a p-type source and a p-type drain formed in a surface thereof and a single area of the substrate which separates all of these regions from each other has intrinsic doping only. The invention also relates to a method of manufacturing such memory devices.

6 Claims, 1 Drawing Sheet

Fig. 1A 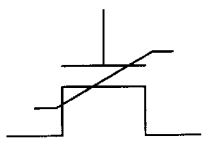 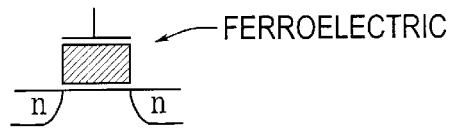
Fig. 1B 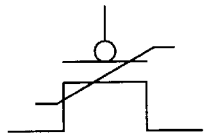 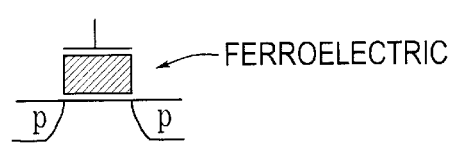

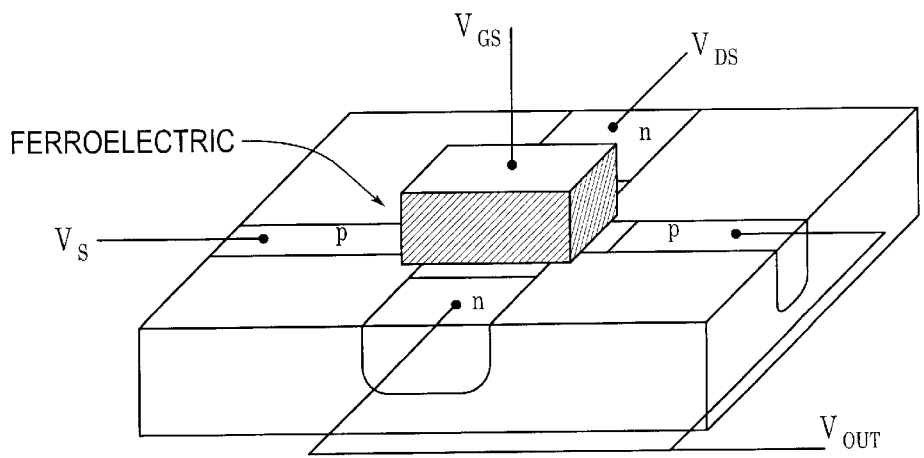
Fig. 3

MEMORY DEVICE

BACKGROUND OF THE INVENTION

1. Field of the Invention

The present invention relates to a memory device for data storage and in particular the invention relates to a memory device which makes use of ferroelectric materials for data storage.

2. Description of the Related Art

Ferroelectric materials can exhibit a non-volatile, bi-stable internal polarisation. The state of polarisation is established by the application of a voltage between opposing surfaces of the material. Having applied a sufficiently large voltage to internally polarise the material, it is subsequently possible to determine the direction of polarisation—which can be used as a binary indicator, whereby the material can act as a data storage medium. However, a problem arises in that the data read operation is destructive of the data. Specifically, the read operation consists of applying a voltage to set the polarisation in a specified direction. If the polarisation is already in that direction no charge exchange is required. However, if the polarisation is in the opposite direction a relatively large amount of charge exchange is required to establish the specified direction of polarisation. Thus, the previous direction of polarisation can be judged according to the high or low (zero) level of charge exchange required to establish the specified polarisation.

A ferroelectric data storage device in which the stored data can be read non-destructively is possible by detecting the polarisation of the ferroelectric material using the field effect. Specifically, using a ferroelectric material in place of the conventional gate oxide layer in a field effect transistor results in a detectable hysterisis in the transfer characteristic of the transistor. This device may conveniently be referred to as a ferroelectric field effect transistor, or FFET. Such a device is very attractive for many applications but it's widespread adoption is hindered by several problems. Firstly, high power consumption occurs during the read operation when the channel of the transistor is in the on state. Secondly, a high voltage is required to write data (switch polarisation direction) when the channel is in the off state.

SUMMARY OF THE INVENTION

It is an object of the present invention to provide a memory device which makes use of the internal polarisation of a ferroelectric material for data storage and in which a non-destructive data read operation can be undertaken. It is an object of one aspect of the present invention to avoid high power consumption during the read operation. It is an object of another aspect of the present invention to avoid the need for a high write voltage during the write operation.

According to a first aspect of the present invention there is provided a memory device comprising a single substrate having an n-type transistor and p-type transistor formed therein; the n-type transistor having an n-type source and an n-type drain; the p-type transistor having a p-type source and a p-type drain; both transistors sharing a single, common channel region and a single, common gate electrode located above the channel region; the source and drains of the transistors being connected in series between the two transistors; and a single, common ferroelectric material separating the gate from the channel.

Preferably, the channel region has intrinsic doping only.

Preferably, the each of the n-type source, the n-type drain, the p-type source and the p-type drain has a region of reduced doping so as to reduce leakage currents between the two transistors.

According to a second aspect of the present invention there is provided a method of reducing power consumption in a memory device which stores data using the polarisation of a ferroelectric material comprising the steps of: providing an n-type transistor and p-type transistor formed in a single substrate with the n-type transistor having an n-type source and an n-type drain and the p-type transistor having a p-type source and a p-type drain; providing a single, common channel region and a single common gate electrode located above the channel region; arranging for the source and drains of the transistors to be connected in series between the two transistors; and providing a single, common ferroelectric material separating the gate from the channel.

Preferably, the method comprises the step of arranging for the channel region to have intrinsic doping only.

Preferably, the method comprises the step of providing each of the n-type source, the n-type drain, the p-type source and the p-type drain with a respective region of reduced doping so as to reduce leakage currents between the two transistors.

BRIEF DESCRIPTION OF THE DRAWINGS

Embodiments of the present invention will now be described in more detail, by way of further example only and with reference to the accompanying drawings, in which:

FIG. 1a illustrates the structure of an n-channel ferroelectric field effect transistor, together with a circuit symbol used herein to denote such a transistor;

FIG. 1b illustrates the structure of a p-channel ferroelectric field effect transistor, together with a circuit symbol used herein to denote such a transistor;

FIG. 3 illustrates a structural implementation of the circuit shown in FIG. 2.

DETAILED DESCRIPTION OF THE PREFERRED EMBODIMENTS

Figure 2:
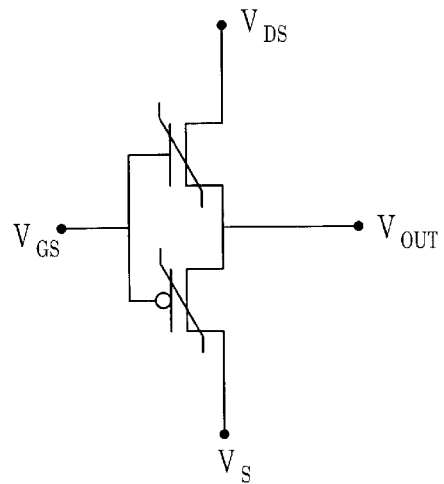
FIG. 2 is a circuit diagram of an embodiment of a memory device according to the present invention.

The basic structure of an n-channel and a p-channel ferroelectric field effect transistor is respectively shown in FIGS. 1a and 1b. In each case an associated circuit symbol is shown. These circuit symbols are used in the circuit diagram of FIG. 2, which depicts an embodiment of the present invention. As readily seen from FIG. 2, the embodiment of the invention comprises a source/drain series connected n-channel ferroelectric transistor and p-channel ferroelectric transistor. The gates of the transistors are connected in common, $V_{GS}$. An output, $V_{out}$, is taken at the source/drain connection between the transistors. The source of the p-channel transistor is annotated $V_S$ and the drain of the n-channel transistor is annotated $V_{DS}$.

Read-out from the memory cell illustrated in FIG. 2 is non-destructive and is voltage rather than current related. The circuit has the advantage of very low drain current and hence minimum power consumption for the Read operation. In particular, even when $V_{GS}$ is zero one of the n-channel and p-channel transistors is nearly on and the other is nearly off, ie one is less resistive than the other. Switching between which of the two transistors is on and which is off is achieved by changing the polarisation of the ferroelectric material. That is, assuming that data has previously been written, so as to set the polarisation of the ferroelectric material in the two transistors to one of two possible directions, that $V_S$ is set to zero and that $V_{DS}$ is set to a small positive value: $V_{out}$ is equal to $V_{DS}$ or zero depending on the direction of polarisation of the ferroelectric material. One of the transistors is on and the other is off, so that $V_{out}$ is connected to $V_S$ or $V_{DS}$. It is to be noted that $V_{DS}$ can be set much smaller (typically several mV) than the voltage (typically 2 V) required to change the direction of polarisation of the ferroelectric material in the two transistors. This ensures that the Read operation is non-destructive. It is assumed that $V_S$ is set at zero for simplicity of explanation only.

The Read operation is voltage based and the drain current involved is at leakage current level. Hence the Read operation can be very fast and its power consumption is minimal.

Data is written to the memory cell by setting $V_{DS}$ and $V_{out}$ to zero and then driving $V_{GS}$ to a sufficiently large positive/negative voltage (typically 2 V) to polarise the ferroelectric material to the positive/negative direction. Of course, the positive/negative directions are used to represent binary states. Although it has been assumed that $V_{DS}$, $V_S$ and $V_{out}$ are set to zero they can be at other voltages. What is required is a sufficient voltage differential across the ferroelectric material to set the internal polarisation thereof in the desired direction.

Typically the write voltage for a FFET can vary from +2 V to −7 V for a p-channel transistor, depending on the direction of polarisation. The electric field generated by the polarisation changes the channel resistance significantly, resulting in a considerably large write current.

FIG. 3 illustrates a structural implementation of the circuit shown in FIG. 2. Described simply, the structure has a substrate with an n-channel extending thereacross in one direction and a p-channel extending thereacross in a direction perpendicular to the n-channel. The n- and p-channels form a cross, the centre of which is covered by a single section of ferroelectric material separating the channels from a single gate electrode. Where the channels cross, beneath the ferroelectric material, is neither n- or p-doped but is inserted left with the intrinsic doping of the material. Typically the substrate will be fabricated from amorphous or polycrystalline silicon. The doped regions, n- and p-, act as the source and drain of the respective n- and p-channel transistors. The channel of each transistor is the intrinsically doped area beneath the ferroelectric material. Preferably, a lower dosage doping is used adjacent the central area (as indicated by the grey shading in FIG. 3). This reduces the cross-leakage between the n- and p-channels.

In the structure illustrated in FIG. 3 there is always one channel path in a high resistance state and one channel path in a low resistance state, regardless of the direction of polarisation of the ferroelectric material. There is always a low resistance path and thus the voltage required for the Write operation is not increased by channel resistance. As a consequence the voltage required to switch the polarisation state (in the Write operation) is limited only by the materials used to fabricate the device. That is, the structure achieves the lowest possible write voltage. The Read operation remains as described above.

In addition to the remarkable effect upon the required write voltage, it will also be appreciated that the structure according to FIG. 3 shares the same ferroelectric material and gate electrode for both transistors. Thus, the total size of the device is considerably reduced compared with separate implementation of the two transistors.

Embodiments according to the present invention can be small in size, can achieve minimal power consumption and the lowest possible operating voltages.

The above described memory cells can be used in a large scale memory matrix and the driving scheme for the matrix may be either active or passive.

The foregoing description has been given by way of example only and it will be appreciated by a person skilled in the art that modifications can be made without departing from the scope of the present invention.

What is claimed is:

1. A memory device, comprising:
  a single substrate having an n-type transistor and p-type transistor formed therein; the n-type transistor having an n-type source and an n-type drain; the p-type transistor having a p-type source and a p-type drain; both transistors sharing a single, common channel region and a single, common gate electrode located above the channel region; the source and drains of the transistors being connected in series between the two transistors; and a single, common ferroelectric material separating the gate from the channel.

2. A memory device as claimed in claim 1, wherein the channel region has intrinsic doping only.

3. A memory device as claimed in claim 1, wherein each of the n-type source, the n-type drain, the p-type source and the p-type drain has a region of reduced doping so as to reduce leakage currents between the two transistors.

4. A method of reducing power consumption in a memory device which stores data using the polarisation of a ferroelectric material, comprising the steps of:
  providing an n-type transistor and p-type transistor formed in a single substrate with the n-type transistor having an n-type source and an n-type drain and the p-type transistor having a p-type source and a p-type drain;
  providing a single, common channel region and a single, common gate electrode located above the channel region;
  arranging for the source and drains of the transistors to be connected in series between the two transistors; and
  providing a single, common ferroelectric material separating the gate from the channel.

5. A method as claimed in claim 4, comprising the step of arranging for the channel region to have intrinsic doping only.

6. A method as claimed in claim 4, comprising the step of providing each of the n-type source, the n-type drain, the p-type source and the p-type drain with a respective region of reduced doping so as to reduce leakage currents between the two transistors.

* * * * *